US010192983B2

(12) United States Patent
Imthurn et al.

(10) Patent No.: US 10,192,983 B2
(45) Date of Patent: *Jan. 29, 2019

(54) LDMOS WITH ADAPTIVELY BIASED GATE-SHIELD

(71) Applicant: Silanna Asia Pte Ltd, Singapore (SG)

(72) Inventors: George Imthurn, San Diego, CA (US); James Douglas Ballard, Solana Beach, CA (US); Yashodhan Vijay Moghe, Marsfield (AU)

(73) Assignee: Silanna Asia Pte Ltd, Singapore (SG)

( * ) Notice: Subject to any disclaimer, the term of this patent is extended or adjusted under 35 U.S.C. 154(b) by 61 days.

This patent is subject to a terminal disclaimer.

(21) Appl. No.: 15/407,174

(22) Filed: Jan. 16, 2017

(65) Prior Publication Data
US 2017/0162658 A1 Jun. 8, 2017

Related U.S. Application Data

(63) Continuation of application No. 14/574,707, filed on Dec. 18, 2014, now Pat. No. 9,559,199.

(51) Int. Cl.
H01L 29/78 (2006.01)
H01L 29/40 (2006.01)
(Continued)

(52) U.S. Cl.
CPC ...... H01L 29/7817 (2013.01); G01R 19/0092 (2013.01); H01L 29/402 (2013.01);
(Continued)

(58) Field of Classification Search
CPC . H01L 29/78; H01L 29/7816; H01L 29/7823; H01L 29/7817; H01L 29/7824; H01L 29/66613; H01L 29/66681
See application file for complete search history.

(56) References Cited

U.S. PATENT DOCUMENTS 5,374,843 A 12/1994 Williams et al.
5,898,198 A 4/1999 Herbert et al.
(Continued)

FOREIGN PATENT DOCUMENTS

WO 2011054280 A1 5/2011

OTHER PUBLICATIONS

ABB, Applying IGCTs, Application Note 5SYA 2032-03, Available at http://www05.abb.com/global/scot/scot256.nsf/veritydisplay/51154b233cdcc83883257cd3002af728/$file/Applying%20IGCTs_5SYA%202032-03.pdf, Accessed on Dec. 10, 2014.
(Continued)

Primary Examiner — Eduardo A Rodela
(74) Attorney, Agent, or Firm — The Mueller Law Office, P.C.

(57) ABSTRACT

An LDFET is disclosed. A source region is electrically coupled to a source contact. A lightly doped drain (LDD) region has a lower dopant concentration than the source region, and is separated from the source region by a channel. A highly doped drain region forms an electrically conductive path between a drain contact and the LDD region. A gate electrode is located above the channel and separated from the channel by a gate dielectric. A shield plate is located above the gate electrode and the LDD region, and is separated from the LDD region, the gate electrode, and the source contact by a dielectric layer. A control circuit applies a variable voltage to the shield plate that: (1) accumulates a top layer of the LDD region before the transistor is switched on; and (2) depletes the top layer of the LDD region before the transistor is switched off.

20 Claims, 4 Drawing Sheets

(51) Int. Cl.
H01L 29/66 (2006.01)
G01R 19/00 (2006.01)

(52) U.S. Cl.
CPC .......... H01L 29/404 (2013.01); H01L 29/407 (2013.01); H01L 29/66681 (2013.01); H01L 29/7816 (2013.01); H01L 29/7823 (2013.01); H01L 29/7826 (2013.01); H01L 29/7835 (2013.01)

(56) References Cited

U.S. PATENT DOCUMENTS

| | | | |
|---|---|---|---|
| 5,907,173 A | 5/1999 | Kwon et al. | |
| 5,912,490 A | 6/1999 | Hebert et al. | |
| 6,222,229 B1 * | 4/2001 | Hebert | H01L 29/0692 257/327 |
| 6,465,845 B1 * | 10/2002 | Baek | H01L 29/0847 257/343 |
| 7,049,669 B2 | 5/2006 | Ma et al. | |
| 7,262,476 B2 | 8/2007 | Bude et al. | |
| 7,282,765 B2 | 10/2007 | Xu et al. | |
| 7,365,402 B2 | 4/2008 | Ma | |
| 7,683,426 B2 | 3/2010 | Williams et al. | |
| 7,986,186 B2 | 7/2011 | Marbell et al. | |
| 8,008,977 B2 | 8/2011 | Tserng et al. | |
| 8,063,446 B2 | 11/2011 | Ko | |
| 8,212,315 B2 | 7/2012 | Lotfi et al. | |
| 8,264,039 B2 | 9/2012 | Wang et al. | |
| 8,450,802 B2 | 5/2013 | De et al. | |
| 8,604,513 B2 | 12/2013 | Ashida et al. | |
| 8,680,615 B2 | 3/2014 | Mitra et al. | |
| 8,748,271 B2 | 6/2014 | Toh et al. | |
| 9,559,199 B2 * | 1/2017 | Imthurn | |
| 9,633,994 B2 * | 4/2017 | Babcock | H01L 27/0623 |
| 9,633,995 B2 * | 4/2017 | Babcock | H01L 21/32139 |
| 2002/0109184 A1 | 8/2002 | Hower et al. | |
| 2004/0201078 A1 | 10/2004 | Ren | |
| 2005/0280087 A1 | 12/2005 | Babcock et al. | |
| 2006/0113625 A1 * | 6/2006 | Bude | H01L 29/1083 257/491 |
| 2010/0085120 A1 | 4/2010 | Marbell et al. | |
| 2011/0073946 A1 | 3/2011 | H. et al. | |
| 2012/0168817 A1 * | 7/2012 | Abou-Khalil | H01L 29/402 257/133 |
| 2012/0228705 A1 * | 9/2012 | Toh | H01L 29/42368 257/339 |
| 2013/0146973 A1 * | 6/2013 | Mitra | H01L 29/7835 257/335 |
| 2014/0103968 A1 * | 4/2014 | Heringa | H01L 29/402 327/109 |
| 2014/0117446 A1 * | 5/2014 | Ren | H01L 29/78 257/343 |
| 2015/0200198 A1 * | 7/2015 | Chen | H01L 29/66681 257/322 |
| 2015/0340448 A1 * | 11/2015 | Babcock | H01L 27/0623 257/340 |
| 2016/0056114 A1 * | 2/2016 | Gao | H01L 23/60 257/340 |
| 2016/0181420 A1 | 6/2016 | Imthurn et al. | |

OTHER PUBLICATIONS

Abou-Khalil, et al., Lateral Tapered Active Field-Plate LDMOS Device for 20V Application in Thin-Film SOI, Proceedings of the 25th Int. Symp. on Power Semiconductor Devices & ICs, Kanazawa, JP, May 2013.

Brech, et al., Voltage Optimization for State of the Art RF-LDMOS for 2.1 GHz W-CDMA Cellular Infrastructure Applications, RF & DSP Infrastructure Division, Semiconductor Products Sector, Motorola, IEEE, Jun. 2003.

Fujishima, et al., A 700V Lateral Power MOSFET with Narrow Gap Double Metal Field Plates Realizing Low On-resistance and Long-term Stability of Performance, Proceedings of the 2001 Int. Symp. on Power Semiconductor Devices & ICs, Osaka, JP, Jun. 2001.

International Rectifier, Using Standard Control ICs to Generate Negative Gate Bias for MOSFETs and IGBTs, Technical Document DT92-3, Available at: http://www.irf.com/technical-info/designtp/dt92-3.pdf , Accessed on Dec. 10, 2014.

International Search Report and Written Opinion dated Feb. 16, 2016 for PCT Patent Application PCT/IB2015/059637.

Marbell, et al., Adaptive LDMOSFET Drain and Dummy-Gate Biases for Highly Modulated Signals, IEEE Transactions on Electron Devices, vol. 55, No. 12, pp. 3555-3561, Dec. 2008.

Marbell, et al., Effects of Dummy Gate on Breakdown and Degradation of LDMOSFETs, IEEE Transactions on Device and Materials Reliability, vol. 8, No. 1, pp. 193-202, Mar. 2008.

Marbell, et al., Modeling and Characterizzation of Effects of Dummy-Gate Bias on LDMOSFETs, IEEE Transactions on Electron Devices, vol. 54, No. 3, pp. 580-588, Mar. 2007.

Notice of Allowance dated Sep. 26, 2016 for U.S. Appl. No. 14/574,707.

Office Action dated May 16, 2016 for U.S. Appl. No. 14/574,707.

\* cited by examiner

LDMOS WITH ADAPTIVELY BIASED GATE-SHIELD

CROSS-REFERENCE TO RELATED APPLICATIONS

This application is a continuation of U.S. patent application Ser. No. 14/574,707, filed Dec. 18, 2014, which is incorporated by reference herein in its entirety for all purposes.

BACKGROUND OF THE INVENTION

Semiconductor power devices have been in use since the early 1950s. They are specialized devices used as switches or rectifiers in power electronics circuits. Semiconductor power devices are characterized by their ability to withstand high voltages and large currents as well as the high temperatures associated with high power operation. For example, a switching voltage regulator will comprise two power devices that constantly switch on and off in a synchronized manner to regulate a voltage. The power devices in this situation need to sink system-level current in the on state, withstand the full potential of the power supply in the off state, and dissipate a large amount of heat. The ideal power device is able to operate in high power conditions, can rapidly switch between on and off states, and exhibits low thermal and on-state resistance.

A transistor structure referred to as a lateral diffusion metal oxide semiconductor (LDMOS) can be used to implement a power device. The "lateral diffusion" portion of this term refers to an extension of the drain region that is less strongly doped than the core drain region and that extends laterally away from the channel. This region is often referred to as the low-doped or lightly-doped drain (LDD) region. The LDD region allows the transistor to switch high voltages by making it able to withstand greater voltages in the off-state by absorbing portions of the electric field that would otherwise cause source-drain punch through, and to handle larger currents in the on-state by preventing a large potential drop from building up at the drain-body interface which would otherwise result in degradation of the device via the injection of hot carriers into the body of the device.

LDMOS transistors can include a gate shield that covers at least a portion of the LDD region and the gate electrode. The gate shield blocks the LDD region and the gate from the large current and voltage signals that are applied to the drain contact of the device. As such, the gate shield lowers the gate-to-drain capacitance of the LDMOS structure. In addition, the gate shield allows for a higher doping of the LDD because the LDD is less affected by large voltage signals applied to the drain contact of the device. As a result, the on-state resistance of the power device can decrease while preserving the device's breakdown and punch-through resistance.

FIG. 1 displays cross section 100 of an LDMOS transistor. The transistor comprises an active region 101 of a semiconductor wafer with an LDD 102 formed therein along with a drain region 103 and source region 104. A channel is formed between LDD 102 and source region 104 under the influence of a voltage applied to gate electrode 105. Gate electrode 105 is separated from the active region by a gate insulator 106. Gate shield 107 is coupled to source contact 108 and shields the gate electrode 105 and LDD 102 from drain contact 109. The source contact 108 of the power device is connected to ground. The gate shield is therefore also biased at ground to provide an adequate shield for LDD 102 and gate electrode 105 without disturbing the carriers in LDD 102. The gate shield is isolated from LDD 102 by an interlayer dielectric 110. The interlayer dielectric also provides a surface for additional circuitry such as integrated wiring between portions of the same integrated circuit.

SUMMARY OF INVENTION

In one embodiment, a lateral diffusion field effect transistor (LDFET) and an associated control circuit are provided. The embodiment comprises a source region of doped semiconductor material that is electrically coupled to a metallic source contact. The embodiment also comprises a first doped drain region of doped semiconductor material that has a lower dopant concentration than the source region. The embodiment also comprises a second doped drain region of doped semiconductor material that: (1) forms an electrically conductive path between the metallic drain contact and the first doped drain region; and (2) has a higher dopant concentration that the first doped drain region. The embodiment also comprises a channel that separates the source region and the first doped drain region. The embodiment also comprises a gate electrode located above the channel and separated from the channel by a gate dielectric. The embodiment also comprises a shield plate located above the gate electrode and the first doped drain region, and separated from the first doped drain region, the gate electrode, and the source contact by an interlayer dielectric. The control circuit applies a variable voltage to the shield plate that: (1) pulls majority carriers in the first doped drain region towards the shield plate before the transistor is switched on; and (2) pushes majority carriers in the first doped drain region away from the shield plate before the transistor is switched off.

In another embodiment, an LDFET and an associated control circuit are provided. The embodiment comprises a source region of doped semiconductor material that is ohmically coupled to a metallic source contact. The embodiment also comprises a first doped drain region of doped semiconductor material that has a lower dopant concentration than the source region, wherein the source region and the first doped drain region have a matching conductivity type. The embodiment also comprises a second doped drain region of doped semiconductor material that: (1) forms an electrically conductive path between the metallic drain contact and the first doped drain region; (2) has the matching conductivity type; and (3) has a higher dopant concentration that the first doped drain region. The embodiment also comprises a channel that separates the source region and the first doped drain region, wherein the channel has an opposite conductivity type to the matching conductivity type, and wherein the first doped drain region extends at least twice as far from the channel as the source region extends from the channel. The embodiment also comprises a gate electrode located above the channel and separated from the channel by a gate dielectric, wherein a control voltage applied to the gate electrode controls a flow of current in the channel. The embodiment also comprises a shield plate located above the gate electrode and the first doped drain region, and insulated from the first doped drain region, the gate electrode, and the source contact by an interlayer dielectric. The shield plate is electrically insulated from the gate electrode. The control circuit applies a variable voltage to the shield plate that: (1) pulls majority carriers in the first doped drain region towards the shield plate before the transistor is switched on; and (2) pushes majority carriers in the first doped drain region away from the shield plate before the transistor is switched off.

In another embodiment, an LDFET is provided. The LDFET comprises a source region is electrically coupled to a source contact. The LDFET also comprises a lightly doped drain (LDD) region that has a lower dopant concentration than the source region, and that is separated from the source region by a channel. The LDFET also comprises a highly doped drain region that forms an electrically conductive path between a drain contact and the LDD region. The LDFET also comprises a gate electrode that is located above the channel and that is separated from the channel by a gate dielectric. The LDFET also comprises a shield plate that is located above the gate electrode and the LDD region, and that is separated from the LDD region, the gate electrode, and the source contact by a dielectric layer. The LDFET also comprises a control circuit that applies a variable voltage to the shield plate that: (1) accumulates a top layer of the LDD region before the transistor is switched on; and (2) depletes the top layer of the LDD region before the transistor is switched off.

DETAILED DESCRIPTION OF THE EMBODIMENTS

Figure 1:
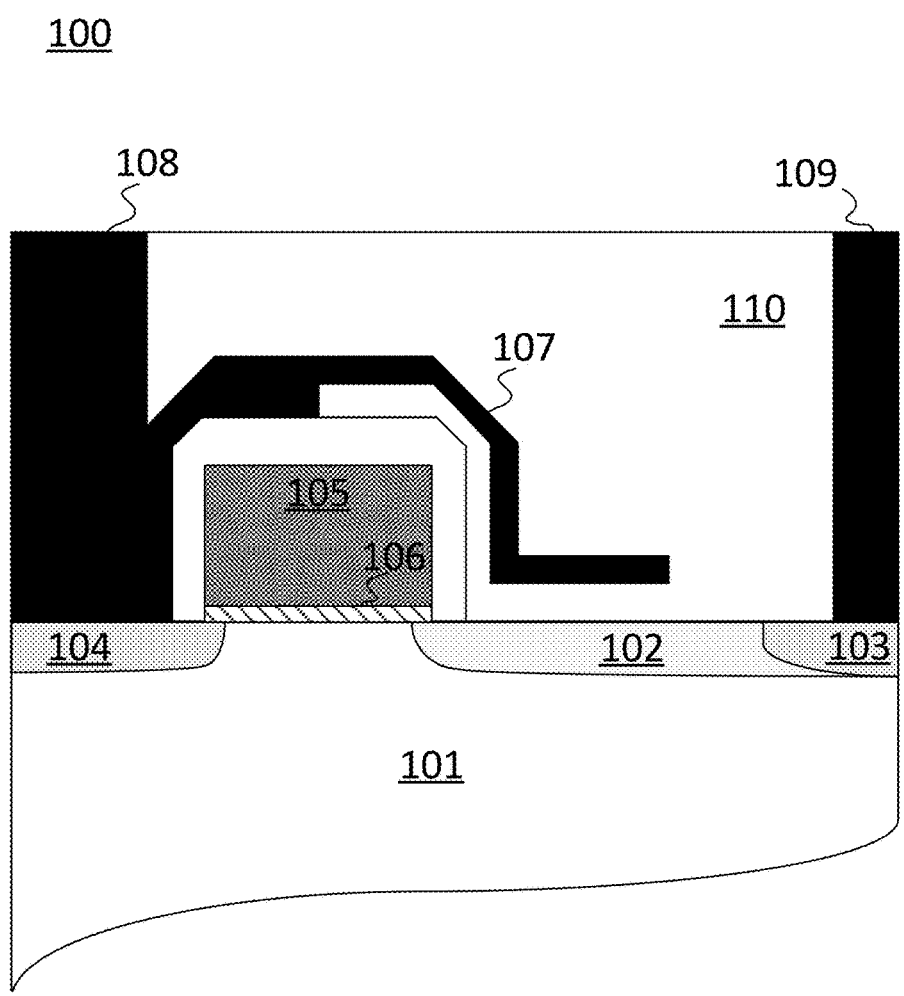
FIG. 1 illustrates a cross section of a lateral diffusion transistor that is in accordance with the related art.

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

The lightly doped drain (LDD) region of a lateral diffusion field effect transistor (LDFET) provides the device with an increased breakdown voltage at the expense of increasing the on-resistance of the transistor. Increasing the breakdown voltage of the transistor can be achieved by decreasing the doping level of the LDD or by extending the lateral expanse of the LDD both of which also increase the on-resistance of the device. However, both of these alterations cause a commensurate increase in the on-resistance of the transistor because the impedance of a region of material is directly proportional to the length of the region in the direction of current flow, and because the conductivity of a region of semiconductor material for a particular carrier type is directly proportional to the dopant concentration of a matching conductivity type dopant. This interrelationship presents a difficult design problem because the on-state resistance of a power device must be kept low or the device will burn a significant amount of power when it sinks the large currents that power devices are meant to handle.

The direct trade-off between breakdown voltage and on-resistance can be severed by separately biasing the gate shield of an LDFET transistor with an adaptive voltage that changes based on the state of the device. This approach can be applied to any similar device that includes a lower conductivity region for enhancing breakdown voltages that is shielded from a device contact. For purposes of this disclosure, the LDFET will be applied to describe this family of similar devices. In particular, LDFETs are not limited to devices having metal gate electrodes and oxide gate insulators. The adaptively biased gate shield of an LDFET can still decrease gate to drain capacitance, but it can further serve to decrease the on-resistance of the device while at the same time increasing the breakdown voltage of the device. Instead of being coupled to the source, the gate shield can be connected to a separate control circuit. In some situations, this control circuit is capable of providing a voltage to the gate shield that is less than ground or greater than the supply voltage of the integrated circuit to which it is a part. This bias voltage serves to prevent a build-up of majority carriers in the LDD and thereby combats the effect of a large voltage applied to the drain contact of the device.

Figure 2:
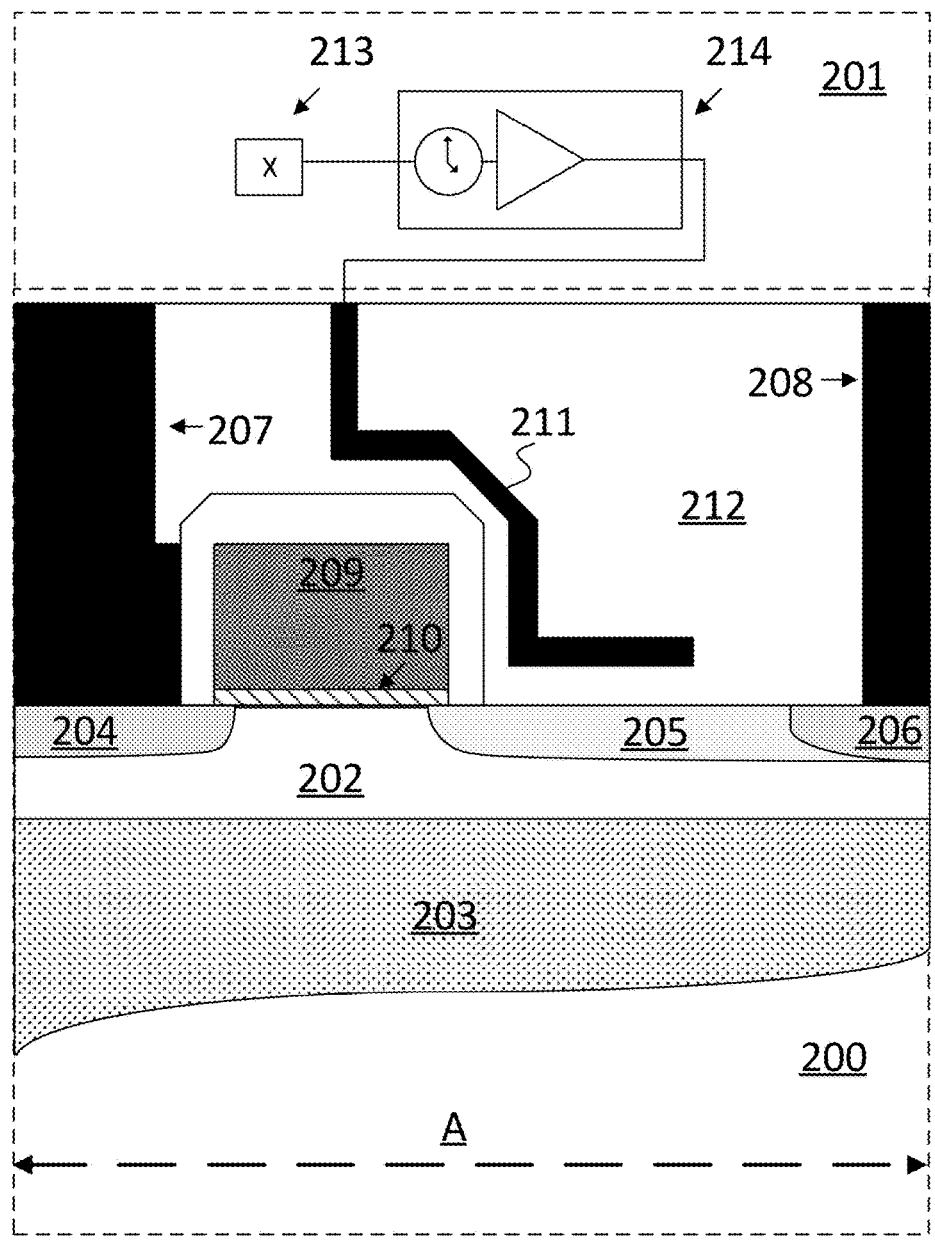
FIG. 2 illustrates a cross section of a lateral diffusion transistor and an accompanying circuit schematic that are in accordance with embodiments of the present invention.

FIG. 2 illustrates a semiconductor cross section 200 and an associated circuit schematic 201 that illustrate an approach for improving the on-resistance and voltage hold off of a device over that of an LDFET in which the gate shield is coupled to the source. Cross section 200 includes an LDFET with an active region 202. The active region 202 can be a doped portion of the bulk of a semiconductor wafer, a localized well formed in a larger doped portion of a semiconductor wafer, the active region of a semiconductor-on-insulator (SOI) wafer, or a localized well formed in an SOI wafer. As illustrated, active region 202 is a thin film formed over the buried insulator 203 of an SOI wafer.

Active region 202 includes source region 204, lightly doped drain (LDD) region 205, and drain region 206. All three regions can comprise doped semiconductor material formed by, for example, the implant of impurities into active region 202. The doped semiconductor material of each region has a similar conductivity type. Therefore, each region can be formed by the same dopant species such as through the implant of one kind of dopant atom. LDD region 205 has a lower dopant concentration than drain region 206 and may also have a lower dopant concentration than source region 204. The LDD region 205 is what provides the LDFET with its superior performance as a power device in terms of its ability to hold off large voltages and not degrade while sinking large currents. The presence of LDD region 205 provides the LDFET with its characteristic of having asymmetric source and drain regions. In some approaches, LDD region 205 generally extends at least twice as far from the channel as the source region extends from the channel. Source region 204 is electrically coupled to source contact 207. Drain region 206 is electrically coupled to drain contact 208. Drain region 206 can be a highly doped drain region and can form an electrically conductive path between drain contact 208 and LDD region 205.

Source contact 207 and drain contact 208 provide electrical connections to the LDFET from other circuitry which may or may not be integrated with the LDFET on the same integrated circuit. Source region 204 can be electrically coupled to source contact 207 via a silicide layer formed on the surface of source region 204. More generally, source region 204 can be coupled to source contact 207 using any process that forms an ohmic or non-rectifying contact between the two regions of the structure. The connection between drain contact 208 and drain region 206 can comprise any of the variations described above with reference to source contact 207 and source region 204. Source contact 207 and drain contact 208 can comprise a metal, metal alloy, metal silicide, or an electrically conductive semiconductor material such as doped polysilicon. Exemplary metals, metal alloys, and metal silicides can each comprise copper, tungsten, molybdenum, and aluminum.

The LDFET in cross section 200 operates as a switch by presenting a variably electrically conductive path from drain contact 208 to source contact 207 through a channel that separates source region 204 and LDD region 205. The channel has an opposite conductivity type to source region 204 and LDD region 205 and separates those two regions from each other. The variability in the conductivity of the electrical path is influenced by a control voltage applied to gate electrode 209 which is separated from the channel by gate dielectric 210. A voltage applied to the gate electrode controls a flow of current in the channel by changing a concentration of free carriers in the channel which thereby creates a localized change in the conductivity type of the channel. From a first order perspective, the LDFET will conduct current when the conductivity type of the localized region matches that of LDD region 205 and source region 204, and will not conduct current when the conductivity type of the localized region is the opposite of that of LDD region 205 and source region 204.

Shield plate 211 is located above gate electrode 209 and LDD region 205. The shield plate can be isolated and separated from the LDD region of the LDFET using an interlayer dielectric that is etched prior to the formation of the shield plate. The same interlayer dielectric can then be formed over the shield plate to isolate it from additional circuity. As illustrated, shield plate 211 is separated from LDD region 205, gate electrode 209, and source contact 207 by interlayer dielectric 212.

Shield plate 211 is not connected to source contact 207 and is instead electrically isolated from the source. In specific approaches, the gate shield of an LDMOS device is biased by an externally applied voltage. The externally applied voltage can be lower than the voltage applied to the source. These approaches include those in which the source is biased at a ground voltage such that the externally applied voltage is negative. In addition, although cross section 200 has been discussed with reference to an n-channel LDFET in which source region 204 and LDD region 205 have an n-type conductivity, the approaches discussed herein apply to LDFETs of either conductivity type by switching the polarity of the discussed control signals. In this particular instance, for a p-channel LDFET, the shield plate 211 could be biased at a voltage in excess of the bias applied to the source region. These approaches include those in which the source is biased at the supply voltage such that the externally applied voltage exceeds the supply voltage.

The gate shield can be biased via a contact that is formed in various ways. The processing steps used to form the contact can be similar to those used to form source contact 207 and drain contact 208. As illustrated, the contact to gate shield 211 is drawn as a vertical contact down through interlayer dielectric 212. However, the contact to gate shield 211 does not need to be in the same plane as the channel of the device. Indeed, parasitic capacitance can be decreased in situations where the contact is outside a lateral extent of the LDFET. For example, the gate shield could extend out of the plane of the page to a portion that extends beyond the edge of active region 202, and contact to the gate shield could be formed above that portion of the gate shield. Multiple contacts could also be made to gate shield 211 through interlayer dielectric 212 to decrease the impedance of the conductive paths by which each portion of gate shield 211 were biased.

The externally applied voltage can be provided by circuity that is integrated on the same integrated circuit as the LDFET or from an external circuit. For example, a charge pump or generic negative voltage generator can be integrated with the LDFET and used to generate the applied voltage. As another example, a control circuit can be formed using standard transistors that are co-integrated with the LDFET. These standard transistors could be complementary metal oxide semiconductor FETs integrated with the LDFET. An associated control circuit, such as control circuit 201, could be integrated on a monolithic substrate with the LDFET and could comprise a set of standard complementary FETs. Control circuit 201 could also be part of the same integrated circuit as LDFET cross section 200, but be formed on a separate wafer to form a multi-substrate or 3D integrated circuit. Likewise, control circuit 201 could be part of the same package as LDFET cross section 200, but be located on a separate die in a multi-die package or 3D package. Although control circuit 201 is illustrated as being formed above cross section 200, this is for illustrative purposes only. The circuit represented by circuit schematic 201 could be formed above cross section 200 on the same monolithic substrate, or it could be formed on another laterally spaced apart portion of the substrate and be connected to the LDFET by a metallization layer above and extending laterally between those two portions of the substrate.

Control circuit 201 can be set to apply a variable voltage to shield plate 211. The variable voltage can pull majority carriers in LDD region 205 towards shield plate 211 before the transistor is switched on and can push majority carriers in LDD region 205 away from shield plate 211 before the transistor is switched off. The variable voltage can be different based on the state of the switch. For example, the voltage could vary between different values when the switch was in the on-state, and the channel was providing a conductive path between source contract 207 and drain contact 208, and when the switch was in the off-state, and the channel was not providing a conductive path between source contract 207 and drain contact 208.

Providing a variable voltage to shield plate 211 serves to decouple the negative effect of LDD region 205 as to the on-state resistance of the LDFET and the positive effect of LDD region 205 as to the breakdown voltage of the LDFET by making the effective dopant concentration of LDD region 205 variable for a given device. As majority carriers are pulled toward gate shield 211 in the on-state, the conductivity of LDD region 205 will increase and the overall conductive path between drain contract 208 and source contract 207 will have lower impedance. As breakdown voltage are relatively not a concern in the on-state, the effective alteration of the dopant concentration towards a higher concentration will not have a deleterious effect on the device. Likewise, as majority carriers are pushed away from shield plate 211 in the on-state, the conductivity of LDD region 205 will decrease and the ability of LDD region 205 to prevent hot carrier injection into active region 202 and generally strengthen the LDFET against the application of high voltages will increase. As the conductivity of LDD region 205 is generally not a concern in the off-state, the effective alteration of the dopant concentration towards a lower concentration will not have a deleterious effect on the device.

The control circuit can vary the voltage applied to the gate shield using various approaches to provide the LDFET performance benefits described above. As illustrated, control circuit 201 includes a control pin 213 and a delayed buffer circuit 214. The signal applied to control pin 213 could match a control signal that would ultimately control gate electrode 209. In these approaches, the delay of the delay buffer could be zero and the control signal would be delayed before being delivered to the gate electrode. In other approaches, control pin 213 may be connected to a sense circuit that measures the amount of current that the LDFET is currently sinking, or will be sinking in the near future, and could linearly adjust the voltage applied to gate shield 211 based on the measured current. In situations in which control circuit 201 and LDFET cross section 200 are implemented on the same monolithic substrate, the control pin 213 can provide a connection to circuitry that is external to the integrated circuit or it can provide a connection to other internal circuitry on the same monolithic substrate as control circuit 201.

Control circuit 201 can ramp the variable voltage between a ground voltage and a supply voltage including ramping the voltage from a negative voltage that is below ground, or from a voltage that is greater than the supply voltage. The ramping of the applied voltage can be conducted based off of the voltage applied to the gate of the LDFET. As mentioned above, the ramp would generally ramp from a negative voltage for the off state of an n-type LDFET and from a voltage greater than the supply voltage for the off state of a p-type LDFET. In particular, the control circuit 201 can ramp the voltage applied to gate shield 211 in synchronization with the control signal applied to gate electrode 209.

As mentioned above, control pin 213 could receive a signal based off of the same control signals used to apply a voltage to gate electrode 209. However, in certain approaches control circuit 201 will begin ramping the voltage applied to the gate shield before the transistor is switched on and complete ramping after the transistor is switched on. In these situations, the signal applied to control pin 213 may need to anticipate the voltage applied to gate electrode 209 such that the voltage applied to gate shield 211 would begin ramping before the voltage applied to gate electrode 209 began changing to change the state of the LDFET. Likewise, in certain approaches control circuit 201 will begin ramping the voltage applied to the gate shield 211 before the LDFET is switched off and will complete ramping the voltage applied to gate shield 211 after the transistor is switched off. In certain approaches, the ramping of the voltage on gate shield 211 will be slow enough that it will not ramp to its final level until the state of the LDFET has changed. In other approaches, delay circuit 214 could delay the ramping of the voltage applied to the gate shield to assure that the LDFET had turned completely on before the gate shield bias reached its final value. In other approaches, the delay circuit may include hysteresis such that ramping in one direction was delayed as compared to the other direction. Such approaches would benefit from this hysteresis by not altering the conductivity of LDD region 205 unless the transistor was completely turned on while allowing the conductivity of the LDD region 205 to quickly return to an off-state. This type of approach would protect the transistor in situations where the low impedance state of LDD region 205 was more problematic because breakdown damage can cause irreversible damage to the device as compared to the increase in power consumption and heat generation that would accompany a temporary increase in the on-state resistance of the LDFET.

Figure 3:
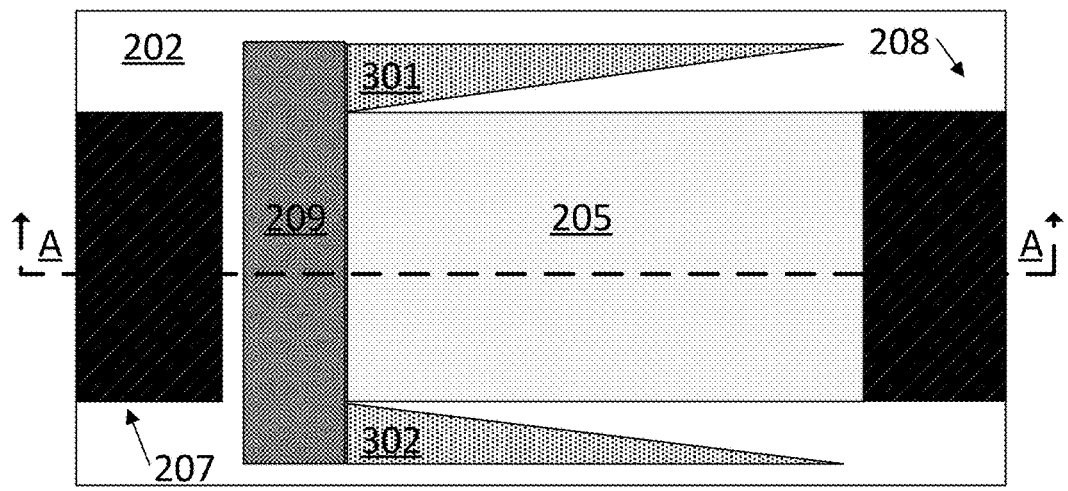
FIG. 3 illustrates a plan view of a lateral diffusion transistor that is in accordance with embodiments of the present invention.

FIG. 3 illustrates a plan view 300 of the same semiconductor structure illustrated by cross section 200 in FIG. 2. Reference line A is common to both figures. Plan view 300 does not include several layers of the semiconductor structure in order to make lower layers of the structure visible from a plan perspective. In particular, interlayer dielectric 212 and gate shield 211 are not present in plan view 300. The lowest visible layer is active layer 202 which is represented by the rectangle forming the outline of the content of plan view 300. The highest visible layer comprises the conductive material used to form source contact 207 and drain contact 208. Plan view 300 also includes gate electrode 209 and LDD region 205. Plan view 300 also includes two tapered extensions of the gate shield that are outside the plane defined by reference line A such that they are absent from cross section 200. First tapered extension 301 is located on one side of LDD region 205 and its thickest portion is located on the gate side end of LDD region 205. Second tapered extension 302 is located on an opposite side of LDD region 205, but also has its thickest portion located on the gate side end of the LDD region.

The first and second tapered extensions 301 and 302 are located above the gate electrode and are biased by the externally applied variable voltage such that they are at the same potential as the shield plate. As LDFETs are often distributed in an array pattern on a substrate, the tapered extensions serve to shield the LDD region from adjacent LDFETs. The same decoupling of breakdown voltage and on-state resistance performance is provided by biasing these extensions in the manner described above with reference to the shield plate generally. Tapered extensions 301 and 302 can comprise metal formed above the plane in which the LDD region 205 is formed and can be separated from active region 202 by interlayer dielectric 212. Alternatively, tapered extensions 301 and 302 can be formed in the active region 202 and can comprise regions of heavily doped semiconductor material. In these approaches, the extensions can each be biased using a separate contact formed using the same approaches as discussed above with reference to drain contact 208 and source contact 207. However, the contact can also be formed from the shield plate down to the tapered regions such that it would not be necessary to form an independent contact through interlayer dielectric 212 after the dielectric had been put in place. In other approaches, the first and second tampered extensions 301 and 302 can be coupled to the source of their LDFET or can be connected to a separate externally applied voltage than the gate shield.

Figure 4:
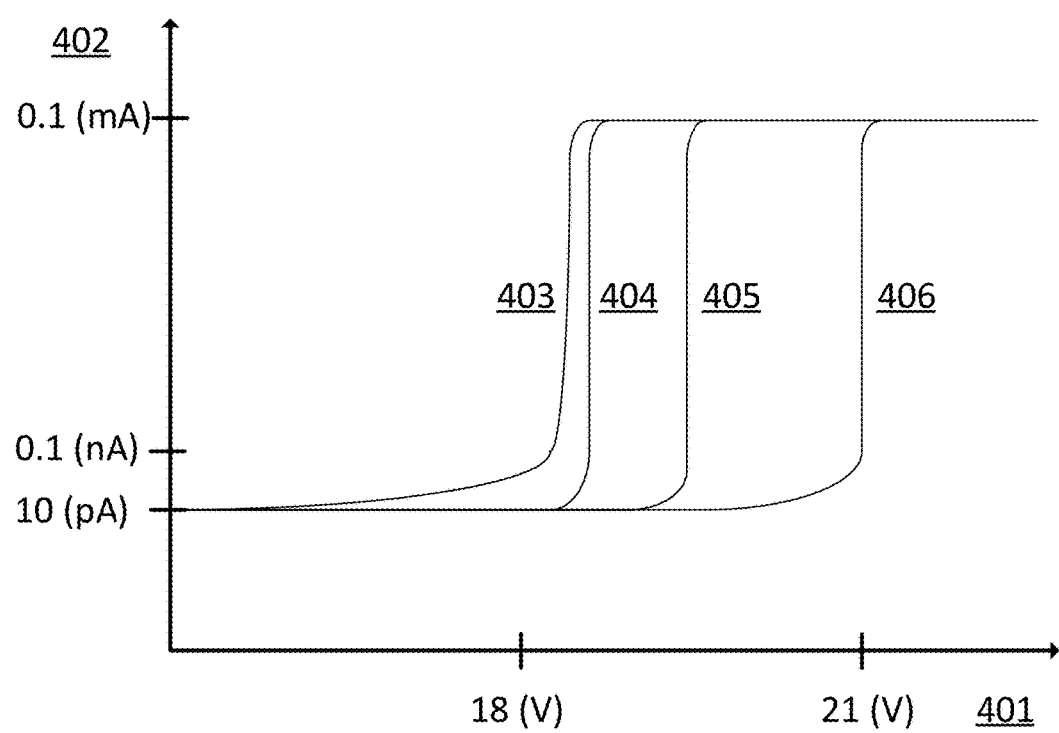
FIG. 4 illustrates a set of waveforms on a single plot charting the drain to source current of a lateral diffusion transistor logarithmically on the y-axis against the drain to source voltage across the lateral diffusion transistor on the x-axis for different voltages applied to the gate shield in accordance with embodiments of the present invention.

FIG. 4 illustrates several waveforms of drain to source voltage against drain to source current for an LDFET on plot 400 having a linear x-axis 401 in units of Volts and a logarithmic y-axis in units of Amperes 402. Waveforms 403, 404, 405, and 406 collectively show how a bias voltage on the gate shield affects the breakdown voltage of an LDFET. All four waveforms show a drain to source current of a negligible 10 pico-Amperes (pA) at a zero volts drain to source voltage. Since the gate bias is at zero volts in all four waveforms, this is to be expected and shows that each bias condition produces a functional off-state transistor. However, in each case, there is a point where the transistor can no longer hold off a certain drain to source voltage and the transistor breaks. This point is illustrated by a steep vertical portion of the waveform where the transistor is no longer functionally "off" as it is conducting current in the milli- Amperes (mA) range despite having a gate control voltage that should leave the transistor in an off-state.

Waveforms 403-06 are for an n-channel transistor and have bias voltages applied to the gate shield of 2V, 0V, −1V, −2V respectively. As illustrated, the effective breakdown voltage of each device increases as a more negative voltage is applied. Similar results could have been achieved by increasing the length or decreasing the dopant concentration of the LDD. However, as described above, the voltage applied to the gate shield is variable such that the effective ability of the transistor to withstand high breakdown voltage can be applied temporarily and then removed when it again became necessary to have a device exhibiting a low on-state resistance.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A system, comprising:
    a lateral diffusion field effect transistor comprising:
        a source region of doped semiconductor material that is electrically coupled to a metallic source contact,
        a first drain region of doped semiconductor material that has a lower dopant concentration than the source region,
        a second drain region of doped semiconductor material that has a higher dopant concentration than the first drain region and forms an electrically conductive path between the first drain region and a metallic drain contact,
        an active region between the source region and the first drain region,
        a gate dielectric between a gate electrode and the active region, wherein the active region is responsive to a control signal applied to the gate electrode, and
        an electrically conductive shield plate separated from the source contact and respective portions of the gate electrode and the first drain region by an interlayer dielectric; and
    a control circuit electrically coupled to the shield plate and configured to apply to the shield plate a variable voltage that is temporally offset from the control signal applied to the gate electrode, wherein the variable voltage is applied to the shield plate at a first level that increases conductivity in the first drain region in a turn-on transition of the lateral diffusion field effect transistor, and the variable voltage is applied to the shield plate at a second level that decreases conductivity in the first drain region in a turn-off transition of the lateral diffusion field effect transistor.

2. The system of claim 1, wherein the control circuit applies the variable voltage to the shield plate at the first level to increase electrical conductivity in the first drain region before the control signal turns on the lateral diffusion field effect transistor, and the control circuit applies the variable voltage to the shield plate to decrease electrical conductivity in the first drain region before the control signal turns off the lateral diffusion field effect transistor.

3. The system of claim 1, wherein the control circuit applies the variable voltage to the shield plate at the first level to increase the conductivity of the first drain region before the control signal applied to the gate electrode opens a channel in the active region, and the control circuit applies the variable voltage to the shield plate at the second level to decrease the conductivity of the first drain region before the control signal closes the channel in the active region.

4. The system of claim 1, wherein the control circuit delays delivery of the control signal to the gate electrode until after the variable voltage is applied to the shield plate.

5. The system of claim 1, further comprising a sense circuit configured to determine a level of current at the drain contact, wherein the control circuit is configured to adjust the variable voltage applied to the shield plate based on the determined level of current.

6. The system of claim 5, wherein the determined level of current at the drain contact corresponds to a level of current that the lateral diffusion field effect transistor currently is sinking.

7. The system of claim 5, wherein the determined level of current at the drain contact corresponds to a level of current that the lateral diffusion field effect transistor is projected to sink.

8. The system of claim 5, wherein the control circuit is configured to linearly adjust the variable voltage applied to the shield plate based on the determined level of current.

9. The system of claim 1, wherein the control circuit is configured to perform operations comprising ramping the variable voltage between a ground voltage and a supply voltage.

10. The system of claim 9, wherein the ramping comprises beginning the ramping of the variable voltage before the lateral diffusion field effect transistor is switched on, and completing the ramping of the variable voltage after the lateral diffusion field effect transistor is switched on.

11. The system of claim 9, wherein the ramping comprises beginning the ramping of the variable voltage before the lateral diffusion field effect transistor is switched off and completing the ramping of the variable voltage after the lateral diffusion field effect transistor is switched off.

12. The system of claim 1, wherein the control circuit is configured to set the variable voltage applied to the shield plate to a negative voltage that is below ground at a time when the lateral diffusion field effect transistor is switched off.

13. The system of claim 1, wherein the shield plate comprises first and second tapered extensions located on opposite sides of the first drain region, and the first and second tapered extensions are thickest at an end of the first drain region nearest the gate electrode.

14. The system of claim 13, wherein the first and second tapered extensions are located above the gate electrode, biased by the variable voltage at the same level as the shield plate, and shield the lateral diffusion field effect transistor from an adjacent lateral diffusion field effect transistor.

15. The system of claim 13, wherein the first and second tapered extensions are formed in a same substrate as the lateral diffusion field effect transistor, and comprise heavily doped semiconductor material.

16. The system of claim 1, wherein the lateral diffusion field effect transistor and the control circuit are integrated on a monolithic substrate.

17. A system, comprising:
    a lateral diffusion field effect transistor comprising:
        a source region of doped semiconductor material that is ohmically coupled to a metallic source contact, a first drain region of doped semiconductor material that has a lower dopant concentration than the source region, a second drain region of doped semiconductor material that has a higher dopant concentration than the first drain region and forms an electrically conductive path between the first drain region and a metallic drain contact, wherein the source region and the first and second drain regions are doped to have a first conductivity type, an active region between the source region and the first drain region, wherein the active region has a second conductivity type opposite the first conductivity type, a gate dielectric between a gate electrode and the active region, wherein the active region is responsive to application of a control signal to the gate electrode, and an electrically conductive shield plate separated from the source contact and respective portions of the gate electrode and the first drain region by an interlayer dielectric; and a control circuit electrically coupled to the shield plate and configured to perform operations comprising:

applying to the shield plate a variable voltage that is temporally offset from the control signal applied to the gate electrode, wherein the applying comprises applying the variable voltage to the shield plate at a first level that increases electrical conductivity in the first drain region before the control signal turns on the lateral diffusion field effect transistor, and applying the variable voltage to the shield plate at a second level that decreases electrical conductivity in the first drain region before the control signal turns off the lateral diffusion field effect transistor.

18. The system of claim 17, wherein the control circuit delays delivery of the control signal to the gate electrode until after the variable voltage is applied to the shield plate.

19. The system of claim 17, further comprising a sense circuit configured to determine a level of current at the drain contact, wherein the control circuit is configured to linearly adjust the variable voltage applied to the shield plate based on the determined level of current.

20. A system, comprising:

a lateral diffusion field effect transistor comprising:

a source region of doped semiconductor material that is ohmically coupled to a metallic source contact, a first drain region of doped semiconductor material that has a lower dopant concentration than the source region, a second drain region of doped semiconductor material that has a higher dopant concentration than the first drain region and forms an electrically conductive path between the first drain region and a metallic drain contact, wherein the source region and the first and second drain regions are doped to have a first conductivity type, an active region between the source region and the first drain region, wherein the active region has a second conductivity type opposite the first conductivity type, a gate dielectric between a gate electrode and the active region, wherein the active region is responsive to application of a control signal to the gate electrode, and an electrically conductive shield plate separated from the source contact and respective portions of the gate electrode and the first drain region by an interlayer dielectric; and a control circuit electrically coupled to the shield plate and configured to perform operations comprising applying to the shield plate a variable voltage that is temporally offset from the control signal applied to the gate electrode, wherein the applying comprises applying the variable voltage to the shield plate at a first level that increases a conductivity of the first drain region before the control signal applied to the gate electrode opens a channel in the active region, and applying the variable voltage to the shield plate at a second level that decreases the conductivity of the first drain region before the control signal closes the channel in the active region.

* * * * *